United States Patent
Vig et al.

(10) Patent No.: US 6,815,944 B2
(45) Date of Patent: Nov. 9, 2004

(54) METHOD AND APPARATUS FOR PROVIDING INFORMATION FROM A SPEED AND DIRECTION SENSOR

(75) Inventors: Ravi Vig, Bow, NH (US); Jay M. Towne, Newbury, NH (US); Glenn Forrest, Nottingham, NH (US)

(73) Assignee: Allegro MicroSystems, Inc., Worcester, MA (US)

( * ) Notice: Subject to any disclaimer, the term of this patent is extended or adjusted under 35 U.S.C. 154(b) by 17 days.

(21) Appl. No.: 10/282,528

(22) Filed: Oct. 29, 2002

(65) Prior Publication Data

US 2003/0141862 A1 Jul. 31, 2003

Related U.S. Application Data

(60) Provisional application No. 60/354,907, filed on Feb. 5, 2002, and provisional application No. 60/353,836, filed on Jan. 31, 2002.

(51) Int. Cl.[7] .............................. G01P 3/66; G01B 7/14; H03M 5/08
(52) U.S. Cl. ............... 324/179; 324/207.2; 324/207.25; 341/53
(58) Field of Search ............................ 324/207.2, 165, 324/179, 207.18, 207.12, 173, 117 H, 607, 207.25, 174; 341/15, 53, 179, 182

(56) References Cited

U.S. PATENT DOCUMENTS

| | | | | |
|---|---|---|---|---|
| 3,304,434 A | * | 2/1967 | Koster | 250/231.14 |
| 4,283,679 A | * | 8/1981 | Ito et al. | 324/165 |
| 4,893,027 A | * | 1/1990 | Kammerer et al. | 307/116 |
| 5,486,759 A | * | 1/1996 | Seiler et al. | 324/207.2 |
| 6,242,904 B1 | | 6/2001 | Shirai et al. | 324/165 |
| 6,297,627 B1 | * | 10/2001 | Towne et al. | 624/207.12 |
| 2001/0002791 A1 | | 6/2001 | Tsuge et al. | 324/174 |

FOREIGN PATENT DOCUMENTS

| | | |
|---|---|---|
| DE | 195 50 935 A1 | 6/1998 |
| DE | 199 61 504 A1 | 6/2001 |

OTHER PUBLICATIONS

Partial International Search for PCT/US 03/02489 issued for the related PCT application; form PCT/ISA/206; 2 pgs. dated Oct. 2, 2003.
Infineon Technologies, "Differential Two–Wire Hall Effect Sensor IC", TLE4942 Preliminary Data Sheet, Jun. 2000, pp. 1–13.
Robert Bosch GMBH Stuttgart, "Active Sensor for ABS/ASR/VDC–Systems with 2–Wire–Current Interface", Specification TLE4941/TLE4942, Version 5, Jul. 25, 2000, 44 pages.

* cited by examiner

*Primary Examiner*—Anjan K. Deb
(74) *Attorney, Agent, or Firm*—Daly, Crowley & Mofford, LLP

(57) ABSTRACT

A method and apparatus for providing information from a speed and direction sensor is disclosed. The method and apparatus detect the presence of a ferromagnetic object as it moves past a sensor. The sensor determines speed and direction information regarding the ferromagnetic object, and further provides information relating to the environment surrounding the sensor or object, such as the status of an air gap between the sensor and the moving object, and the temperature of the environment in which the sensor or object is disposed.

22 Claims, 6 Drawing Sheets

METHOD AND APPARATUS FOR PROVIDING INFORMATION FROM A SPEED AND DIRECTION SENSOR

CROSS REFERENCE TO RELATED APPLICATIONS

This application claims the benefit of U.S. provisional application Nos. 60/353,836 filed Jan. 31, 2002 and 60/354,907 filed Feb. 5, 2002 which applications are hereby incorporated herein by reference in their entirety.

STATEMENT REGARDING FEDERALLY SPONSORED RESEARCH

Not applicable.

FIELD OF THE INVENTION

The present invention relates generally to sensors and more particularly to a method and apparatus for sensing the speed and direction of a moving object and for providing information regarding the environment in which a sensor is disposed.

BACKGROUND OF THE INVENTION

As is known in the art, magnetic sensing devices which can detect the presence of a ferromagnetic object in the vicinity of the sensing device have been widely used. Such sensing devices typically utilize a magnetic field and employ sensing apparatus that detect changes in the strength of the magnetic field. Magnetic field strength is defined as the magnetomotive force developed by a permanent magnet per the distance in the magnetization direction. As an example, an increase in the strength of a magnetic field, corresponding to a drop in the reluctance of a magnetic circuit, will occur as an object made from a high magnetic permeability material, such as iron, is moved toward the magnet. Magnetic permeability is the ease with which the magnetic lines of force designated as magnetic flux, can pass through a substance magnetized with a given magnetizing, force. Quantitatively, it is expressed as the ratio between the magnetic flux density (the number or lines of magnetic flux per unit area which are perpendicular to the direction of the flux) produced and the magnetic field strength, or magnetizing force. Because the output signal of a magnetic field sensing device is dependent upon the strength of the magnetic field, it is effective in detecting the distance between the sensing device and an object within the magnetic circuit. The range within which the object can be detected is limited by the flux density, as measured in Gauss or teslas.

As is also known, where it is desired to determine the speed or rotational position of a rotating object, such as a disk mounted on a shaft, the object is typically provided with surface features that project toward the sensing device, such as teeth. The proximity of a tooth to the sensing device will increase the strength of the magnetic field. Accordingly, by monitoring the output of the sensing device, the rotational speed of the disk can be determined by correlating the peaks in the sensor's output with the known number of teeth on the circumference of the disk Likewise, when the teeth are irregularly spaced in a predetermined pattern, the rotational position of the body can be determined by correlating the peak intervals with the known intervals between the teeth on the disk.

One prominent form of such a sensing device is a Hall effect transducer. A Hall effect transducer relies upon a transverse current flow that occurs in the presence of a magnetic field The Hall effect transducer is primarily driven by a direct current (DC) voltage source having electrodes at both ends of the Hall effect transducer, creating a longitudinal current flow through the sensor's body. In the presence of a magnetic field, a transverse voltage is induced in the transducer that can be detected by a second pair of electrodes transverse to the first pair. The second pair of electrodes can then be connected to a voltmeter to determine the potential created across the surface of the sensor. This transverse voltage increases with a corresponding increase in the magnetic field's strength.

The Hall effect transducer can also be chopper stabilized, wherein for half of some clock cycle the first pair of electrodes receives the DC voltage source creating the longitudinal current flow through the sensor's body. For the second half of the clock cycle, the second pair of electrodes receives this energizing DC voltage. This well-known technique reduces the inherent electrical offsets that may be present in the Hall effect transducer.

The Hall effect transducer is most often integrated into a single integrated circuit that contains conditioning circuitry to amplify and otherwise modify the output of the Hall effect transducer. This integrated circuitry is often referred to as a Hall effect sensor.

The Hall effect sensor is mounted within and perpendicular to a magnetic circuit that can include a permanent magnet and an exciter (the object being sensed). The exciter is a high magnetic permeability element having projecting surface features which increase the strength of the magnet's magnetic field as the distance between the surface of the exciter and the permanent magnet is reduced. Typically, the exciter will be in the form of a series of spaced teeth separated by slots, such as the teeth on a gear. The exciter moves relative to the stationary Hall effect sensor element, and in doing so, changes the reluctance of the magnetic circuit so as to cause the magnetic flux through the Hall effect element to vary in a manner corresponding to the position of the teeth. With the change in magnet flux there occurs the corresponding change in magnetic field strength, which increases the transverse voltage of the Hall effect sensor.

The Hall effect sensor can also detect the proximity of a permanent magnetic material, such as a rotating ring magnet.

With the increasing sophistication of products, magnetic field sensing devices have also become common in products that rely on electronics in their operation, such as automobile control systems. Common examples of automotive applications are the detection of ignition timing from the engine crankshaft and/or camshaft, and the detection of wheel speed for anti-lock braking systems and four-wheel steering systems. For detecting wheel speed, the exciter is typically an exciter wheel mounted inboard from the vehicle's wheel, the exciter wheel being mechanically connected to the wheel so as to rotate with the wheel. The exciter wheel is provided with a number of teeth which typically extend axially from the perimeter of the exciter wheel to an inboard-mounted magnetic field sensor. As noted before, the exciter wheel is formed of a high magnetic permeability material, such as iron, such that as each tooth rotates toward the sensor device, the strength of the magnetic field increases as a result of a decrease in the magnetic circuit's reluctance. Subsequently, the magnetic circuit reluctance increases and the strength of the magnetic field decreases as the tooth moves away from the sensing device. In the situation where a Hall effect device is used, there will be a corresponding peak in the device's potential across the transverse electrodes as each tooth passes near the device.

The sensor's output is dependent upon the distance between the exciter and the sensing device, known as the air gap. More specifically, as the air gap increases, the maximum output range of the device decreases thus decreasing the resolution of the output and making it more difficult to accurately analyze the device's output. The output of a Hall effect device is directly proportional to the strength of the magnetic field, and therefore is sensitive to the air gap at low strength magnetic fields.

An integrated circuit magnetic field sensor assembly typically can include a magnet, and one or more of the above-described Hall effect semiconductor sensors, where the magnetic poles are sensed as they move relative to the Hall effect semiconductor sensor. The assembly can also include a permanent magnet mounted proximal to the Hall effect semiconductor sensor, and a ferrous object then moves relative to the Hall effect semiconductor sensor, and this sensor detects the disturbances in the magnetic field created by the passing ferrous object. The magnet provides a magnetic field. The semiconductor sensors are located within the magnetic field and are utilized for sensing the strength of the magnetic field. The magnetic field sensor allows the detection of a ferromagnetic object passing through the magnetic field. The magnetic field sensor is disposed adjacent to the ferromagnetic object and is positioned from the ferromagnetic object so as to reduce the distance between the magnetic field sensor and the ferromagnetic object and still maintain an air gap between the magnetic field sensor and the ferromagnetic object to allow passage of the ferromagnetic object by the magnetic field sensor. The semiconductor sensors may be realized as Hall effect devices which are used to detect edges of the ferromagnetic object such as a gear tooth. From the detection of the edges of a gear tooth, information relating to the speed and direction of the rotating gear can be determined.

While detecting the speed of and direction of rotating devices has proven useful, further information regarding the rotating device is generally not available. It would, therefore, be desirable to provide a method and apparatus which provides information relating to the speed and direction of a rotating device and to further provide information relating to the environment the device is disposed in.

SUMMARY OF THE INVENTION

A method and apparatus for providing information from a speed and direction sensor is disclosed. The method and apparatus detect the presence of a ferromagnetic object as it moves past a sensor, or detect the disturbances in a magnetic field created by a ferrous object as it moves past a sensor having a permanent magnet in close proximity. The sensor determines speed and direction information regarding the ferromagnetic object, and further provides information relating to the environment surrounding the sensor or object, such as the status of an air gap between the sensor and the moving object, and the temperature of the environment in which the sensor or object is disposed.

In accordance with the present invention, a method of providing information from a speed and direction sensor includes generating at an output of the sensor a data string having a plurality of pulses, wherein a first logic data bit is represented by a first pulse having a first width and a second logic data bit is represented by a second pulse having a second pulse width wherein a first one of the first and second pulse widths is a multiple of a second one of the first and second pulse widths.

With this particular arrangement, a sensor which provides a data string in accordance with a predetermined protocol is provided. In one embodiment, the method includes the step of forming one or more data words using at least two pulses, wherein the data word conveys a characteristic of at least one of a target and an environment in which the target is disposed. By utilizing a protocol in which data words are formed from pulses of various widths, the speed and direction of a moving target as well as diagnostic data can be communicated to various circuits which can utilize this information. In one embodiment, when the target is moving in a first direction, the protocol provides speed and direction information on every edge or pole boundary of the target and the diagnostic data is decoded by measuring the width of each pulse. The diagnostic data can include, but is not limited to, status of an air gap between a sensor and a target and a temperature of the environment in which the sensor or target is disposed. In one embodiment, the first logic data bit corresponds to a logic zero data bit and the second logic data bit corresponds to a logic one data bit and the data string signal protocol includes a start data sequence (SDS) and a plurality of data words, each of the data words separated by a data word separator.

In accordance with a further aspect of the present invention, a magnetic article proximity detector includes a magnetic field sensor for providing an output signal proportional to a magnetic field and a detection circuit to detect at least one of: (a) a parameter of the environment in which the magnetic article is disposed; (b) a parameter of the environment in which the magnetic article proximity detector is disposed; (c) a parameter related to a relationship between the magnetic article proximity detector and the magnetic article; and (d) a parameter of the magnetic article. The magnetic article proximity detector further includes an output control circuit coupled to receive one or more signals from the detection circuit. In response to the one or more signals, the detection circuit provides a data string in accordance with a predetermined protocol in which a first logic data bit having a first logic value in the data string is provided from a single pulse having a first pulse characteristic and a second logic data bit having a second logic value in the data string, is provided from a single pulse having a second pulse characteristic with the second pulse width being related to the first pulse characteristic.

With this particular arrangement, a magnetic article proximity detector is provided which utilizes a protocol which conveys information in the form of data words. In one embodiment, each of the data words include two logic data bits for a total of four possible states for each word. In other embodiments, more than two bits per word can be used in which case more than four states for each data word will exist. In one automotive application, the detector detects information about a rotating ferrous target and provides the information to an engine control unit. Also, in one embodiment the pulse characteristic corresponds to one of a pulse width, a current level and a voltage level. The detection circuit can include at least one of a speed detection circuit, a direction detection circuit, a temperature detection circuit, an air gap detection circuit and a voltage detection circuit. In response to signals fed thereto from the magnetic field sensor, one or more of the speed, direction, temperature, air gap and voltage detection circuits provides an output pulse stream providing speed, direction, and diagnostic information in accordance with a predetermined protocol which includes a data string having a plurality of pulses, one pulse for each edge of a detected target wherein a first logic data bit is represented by a pulse having a first pulse width and a second logic data bit is represented by a pulse having a second pulse width wherein a first one of the first and second pulse widths is a multiple of a second one of the first and second pulse widths.

In accordance with a still further aspect of the present invention, a method includes providing a start data sequence and providing a first data word having a plurality of pulses with each of the plurality of pulses having a pulse characteristic with a first pulse characteristic value corresponding to a first logic value and a second pulse characteristic value corresponding to a second logic value. In one embodiment, the pulse characteristic corresponds to one of a pulse width, a current level and a voltage level and each pulse corresponds to a data bit having a logic value. In one embodiment, the first data word is a first word of a plurality of words in a data string and each data bit is provided from a single pulse having a first or second logic value. With this particular arrangement, a method for conveying information via data words is provided.

BRIEF DESCRIPTION OF THE DRAWINGS

The invention will be more fully understood from the following detailed description taken in conjunction with the accompanying drawings, in which.

DETAILED DESCRIPTION OF THE INVENTION

Figure 1:
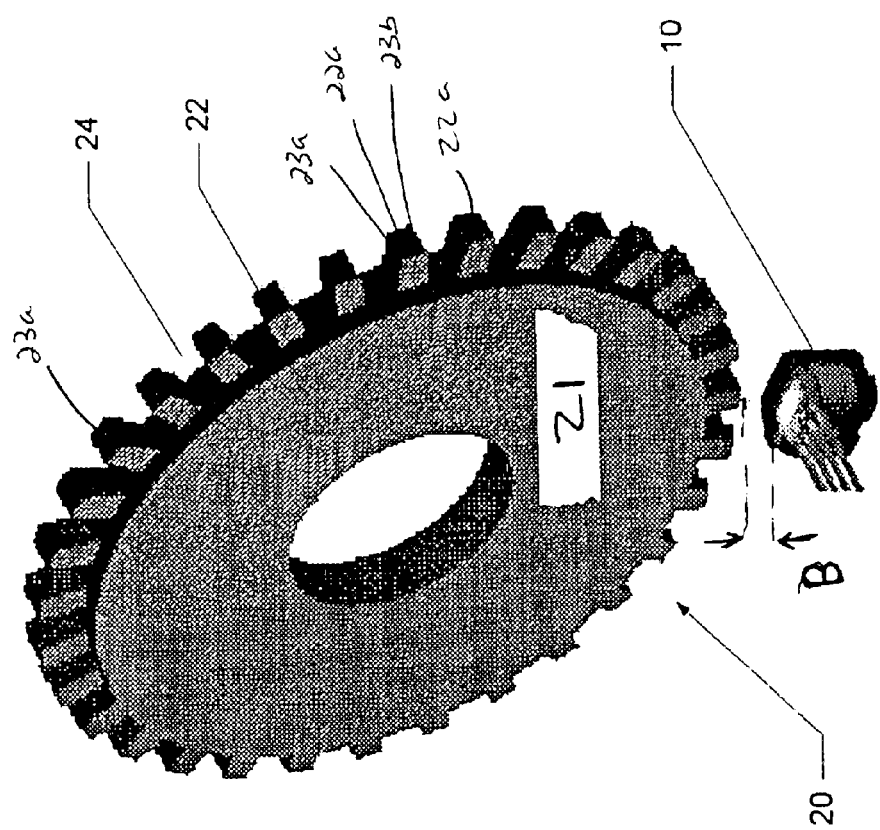
FIG. 1 is a diagram of a sensor disposed adjacent a rotating object.

The present invention comprises a method and apparatus for detecting the speed and direction of a moving object as well as detecting diagnostic conditions (e.g. environmental conditions) of the apparatus or moving object and conveying the information to other circuits or systems in the form of data words. The method and apparatus also make the speed, direction and diagnostic condition information available to other circuitry for further processing. The apparatus includes a magnetic field sensor which provides an output signal proportional to a magnetic field at an output thereof and signal processing circuitry which provides, in response to the detection of ferrous materials by the magnetic field sensor, output signals in accordance with a predetermined protocol which utilizes pulses of varying widths to convey information in the form of digital words. The present invention is particularly suitable for automotive applications, such as detecting the rotational speed of a wheel and an environment for an electronic antilock braking or transmission system. The invention is not, however limited to use in automotive applications.

In a preferred embodiment, the apparatus is provided as a speed and direction sensor which is realized as a Hall effect sensor integrated circuit (IC) and magnet combination which is appropriate for detecting the rotational speed of gear-tooth targets of the type utilized in automotive anti-lock braking system (ABS) and transmission applications. In an ABS application, the gear-tooth target (also referred to herein as an exciter wheel) is rotatably mounted in a wheel housing of a vehicle equipped with an anti-lock braking system. The exciter wheel is engaged for rotation with one of the automobile's wheels, the rotational speed of which is required for feedback to the anti-lock circuitry to prevent complete lockup of the wheel during braking.

It should be appreciated that reference is sometimes made, herein to data words having a particular number of bits, e g two bits. It should be understood that such reference should not be construed as limiting, rather such reference is made only for clarity in description and that the particular number of bits to use in any particular application is selected in accordance with a variety of factors including but not limited to the number of states or levels to be covered (e.g. 2 bits provides 4 different levels, 3 bits provides 8 different levels, 4 bits provides 16 different levels, etc . . . ).

Reference is also sometimes made herein to detection of certain parameters (e g air gap, temperature range, speed, etc . . . ). It should be understood that such references should not be construed as limiting but rather are provided for clarity in description. Those of ordinary skill in the art will appreciate, after reading the description provided herein, that other parameters may also be detected. For example, in some applications it may be desirable to measure or detect parameters such as undervoltage, overvoltage and nominal voltage conditions.

Referring now to FIG. 1, a speed and direction sensor 10 is shown disposed proximate an exciter wheel 20. Exciter wheel 20 includes a hub portion 21 having a plurality of teeth 22 projecting a predetermined distance from a surface of the hub 21. The teeth 22 are spaced apart around the hub portion 22 such that a slot 24 exists between adjacent ones of the teeth 22. The slots 24, thus clearly delineate adjacent teeth 22.

In this particular embodiment, the teeth 22 are substantially identical in size and shape and are evenly spaced around the periphery or circumference of the hub 21. The speed and direction sensor 10 is disposed proximate the teeth 22 so that the teeth 22 and slots 24 alternately pass the speed and direction sensor 10 as the exciter wheel 20 rotates in either clockwise or counter clockwise directions. The teeth 22 thus act as targets which the sensor 10 detects Each tooth 22 has an outer surface 22a and first and second edges 23a, 23b. The distance B between a surface of the speed and direction sensor 10 and the outer surface 22a of a tooth 22 is referred to as the "air gap" distance or more simply, the "air gap." The air gap between the sensor 10 and the surface 22a is ideally selected such that the speed and direction sensor 10 provides the highest possible resolution of the exciter wheel 20, while still providing a large enough air gap to compensate for the unevenness hi the exciter wheel 20 caused by heat expansion, unequal length between teeth 22, wear on the exciter wheel, and other factors which could affect the air gap distance.

In general overview, as teeth 22 pass by the sensor 10, the sensor 10 detects each edge 23a, 23b of each tooth 22 and provides an output pulse signal in response thereto. Each of the pulses in the series of pulse signals corresponds to a logical data bit and is part of a particular inventive protocol as will become clear from the description provided below in conjunction with FIGS. 2–5. The logical value of each data bit depends upon the width of the pulse. Also, if the dimensions of the teeth 22 and the number of teeth 22 in the exciter wheel 20 are known, the output pulses provided by the sensor 10 can be used to determine the speed at which the exciter wheel 20 is rotating.

By utilizing a protocol in which data words are formed from pulses of various widths, the protocol can be used to provide information in the form of data words. In particular, the protocol allows communication of information (e g direction of a moving target as well as diagnostic data related to the sensor and/or the target) to various circuits such as an engine control unit (ECU) for example, which can utilize this information. The diagnostic data can include, but is not limited to, status of the air (rap between the sensor and the target and a temperature of the environment in which the sensor and/or target is disposed.

Figure 2:
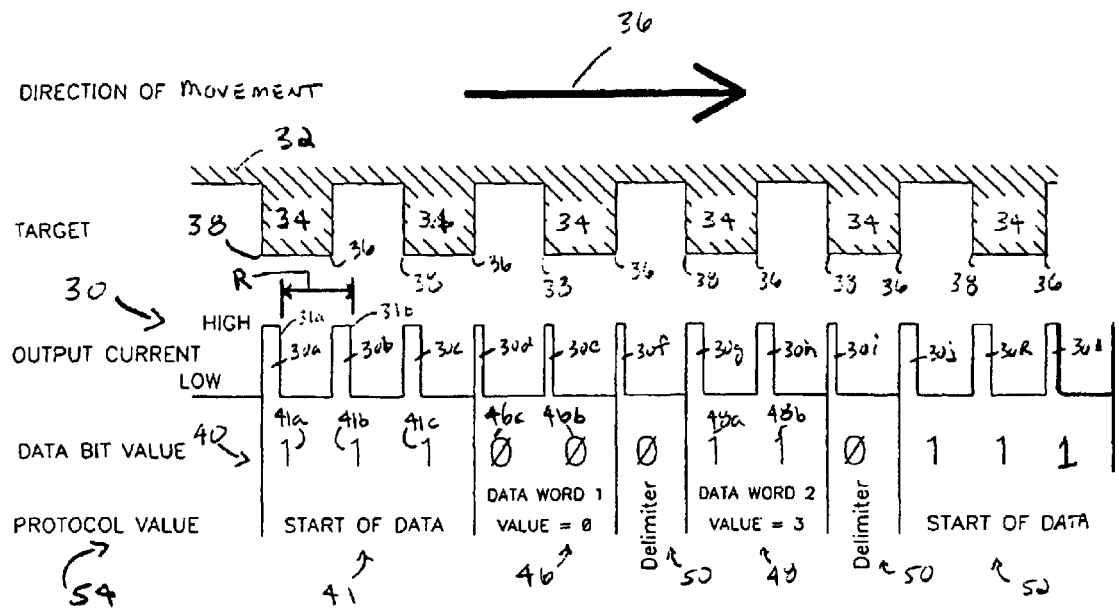
FIG. 2 is a timing diagram showing the sensor output for an object moving in a first direction.

Referring now to FIG. 2, a pulse string 30, comprised of a plurality of pulses 30a–30l provided in accordance with a predetermined protocol is generated in response to a ferrous target 32 moving in a first direction (indicated by reference arrow 36) past a sensor. For clarity in FIG. 2, the sensor has not been shown. For ease of reference, direction 36 is sometimes referred to herein as a left movement or left rotation of the target relative the sensor The target 32 includes a plurality of raised regions or teeth 34, each of which has a first edge 36 and a second edge 38. Teeth 34 and edges 36, 38 may be similar to teeth 22 and edges, 23a, 23b described above in conjunction with FIG. 1. As each edge 36, 38 passes the sensor, the sensor generates one of the pulses 30a–30l in the pulse string 30. Each pulse provides speed, direction and diagnostic data.

The speed at which the target 32 moves relative to the sensor can be provided by a pulse rate. One way to compute the pulse rate is to measure the time interval between edges of two consecutive pulses (e.g. pulse edges 31a and 31b), and relate this time to the known distance (typically in degrees of rotation) between the edges of the corresponding tooth (34). In the embodiment shown in FIG. 2, the distance between the rising edges of two consecutive pulses is used. Of course, other edges and other techniques for computing the target speed from the pulse 30 can also be used.

The direction in which the target 32 is moving as well as diagnostic information can be obtained by measuring the width of one or more of the pulses 30a–30l. In particular, in accordance with the protocol of the present invention, each of the pulses 30 are provided having a first or second pulse width. The first pulse width (e.g. the width of pulses 30d, 30e, 30f, 30i) corresponds to a first logic value and the second pulse width (e.g. the width of pulses 30a, 30b, 30c, 30g, 30h, 30j, 30r) corresponds to a second different logic value. The pulse widths are related in that the first pulse width is approximately half as long as the second pulse width. Assume for the sake of example that the first pulse width is 45 microseconds ($\mu$s) long and that this pulse width represents a logical zero data bit. Then a logical one data bit corresponds to a pulse having a width of about 90 $\mu$s. In this way, the pulse string 30 (which is the waveform provided by a sensor) can be represented as a digital data string 40 (i.e. a stream of data bits each of the data bits having one of two logic values).

The data bits of the data string 40 can be grouped into data words with each data word comprised of a predetermined number of bits. In one particular protocol embodiment, the beginning of a data string (e.g. data string 40) is indicated by a first plurality of bits 41a–41c corresponding to a start data sequence (SDS) 41. In the example of FIG. 2, the SDS 41 is provided as three sequential bits 41a, 41b, 41c each having a logic one bit value. Thus, the first three pulses of the data string form an SDS comprised of logical "1"s which signals the start of a data transmission and is used to notify other circuits (e.g. an ECU) that data is to follow.

The SDS 41, is followed by a plurality of data words 46, 48. In this example, the third bit of the SDS 41 is followed by two data words 46, 48 each of which is comprised of two bits 46a, 46b, 48a, 48b respectively. This yields a total of four logic states for each data word as shown in the Table below.

TABLE

| LOGIC STATE | SECOND BIT | FIRST BIT |
|---|---|---|
| 1 | 0 | 0 |
| 2 | 0 | 1 |
| 3 | 1 | 0 |
| 4 | 1 | 1 |

Each of the data words 46, 48 is followed by a delimiter 50. The value of the delimiter 50 is selected such that the combination of one of the data words 48, 48 and the delimiter 50 can never result in a series of bit which is the same as the SDS. In this particular embodiment, the SDS is provided as three logic one bits in succession and the delimiter 50 is provided as a single bit having a logic zero value. Thus, the combination of one of the data words and the delimiter bit can never result in three logic one bits in succession. This maintains a distinct signature for the SDS 41.

In accordance with the inventive protocol, a data bit (e.g. bit 30d) provided from a pulse having the first pulse width i.e. the 45 $\mu$s pulse, represents the logic zero data bit and a left moving target (e.g. left rotation in the case of the wheel 20 in FIG. 1). Conversely, the data bit provided from the 90 $\mu$s pulse represents the logic one data bit and a left moving target.

As the target moves by the sensor in a first direction (e.g. left), a pulse is produced at each edge of every tooth 34. The resulting pulse string provided by the sensor is shown in FIG. 2 as waveform 30. The pulse string 30 corresponds to the data stringy 40 and to protocol values 54.

It should be appreciated that although the data string 40 described above includes a particular number of bits in the SDS 41 and a particular number of data words 46, 48 in the data string, and a particular number of data bits in the data string, the invention is not so limited. In other embodiments, the data string 40 could contain any number of data words 46, 48 and the data words may contain any number of data bits (e.g. three or more bits).

It should also be appreciated that if more bits are included in the data words, then each individual data word can convey more information (e.g. a 2 bit word has 4 states, a 3 bit data word has 8 states, etc . . . ).

Following the SDS 41, the first data word 46 is presented. In this example, the first data word 46 has a value of zero, since data bits 46a, 46b both correspond to logical "0" data bits. The first data word 46 is followed by a first data word delimiter 50 also comprising a data bit corresponding to a logical "0" data bit. In one embodiment, the first word provides air gap diagnostics information and the second word provides temperature diagnostics.

It should be appreciated that increasing, logic state value does not necessarily correspond directly to increasing signal strength. For example, in one embodiment gray coding is used to reduce the risk of providing confusing information in the data word. For example, assume that the air gap changes in the middle of providing an air gap diagnostic word. In this case it would be undesirable to output confusing data. By using gray coding, however, the logic state values would progress as 0, 1, 3, 2 with 0 representing a minimum value and 2 representing a maximum value. In this manner only 1 bit need change between each logic state value as shown in Table 2 below.

TABLE 2

| LOGIC STATE | SECOND BIT | FIRST BIT |
|---|---|---|
| 0 | 0 | 0 |
| 1 | 0 | 1 |
| 3 | 1 | 1 |
| 2 | 1 | 0 |

For example, when the first data word has a value of zero, this indicates that the air gap B is less than an air gap threshold limit $B_{LIMIT}$ (i.e. $B<B_{LIMIT}$) and thus corresponds to a fault condition. When the first data word has a value of one, this indicates that the air gap value B is greater than the air gap limit $B_{LIMIT}$ and less than an air gap threshold value $B_{THRESHOLD}$ (i e $B_{LIMIT}<B<B_{THRESHOLD}$) thus corresponds to an air gap warning condition. When the first data word has a value of two, this indicates that the air gap value B is greater than the air gap installation value $B_{INSTALL}$ (i.e. $B>B_{INSTALL}$) and thus corresponds to an air gap OK condition When the first data word has a value of three, this indicates that the air gap value B is greater than the air gap threshold Value $B_{THRESHOLD}$ and less than the air gap installation value $B_{INSTALL}$ (i.e. $B_{THRESHOLD}<B<B_{INSTALL}$) and thus corresponds to an installation threshold condition.

As shown in the exemplary embodiment of FIG. 2, the second data word 48 follows the first data word delimiter 50. As mentioned above, the second data word provides temperature diagnostics information. When the second data word has a value of zero, this indicates that the temperature T is below a low temperature threshold value $T_L$ (i.e. $T<T_L$). When the second data word has a value of two, this indicates that the temperature T is above the low temperature threshold value $T_L$ and below a high temperature threshold value $T_H$ (i.e. $T_L<T<T_H$). When the second data word has a value of three, this indicates that the temperature T is above the high temperature threshold value $T_H$ (i.e. $T>T_H$). In the example of FIG. 2, the second data word 48 comprises two logical "1" data bits 48a, 48b and thus data word 48 has a binary value of three. In this embodiment only three logic states corresponding to three temperature ranges are used. Another embodiment could utilize all four available logic states with four corresponding temperature ranges.

It should be appreciated that if each word is comprised of more than two bits, then more than four logic states are available and thus it is possible to provide even wider or more discrete ranges of air gap, temperature and other parameters.

A second data word delimiter 50 follows the second data word 48. The cycle is then repeated with potentially different values in the data words 46 and 48 being presented to a control unit or other processing circuit. In this way the ECU can receive continuously updated information about the sensor and its environment.

As the relative speed between the target and the sensor increases, the falling edge of the logic one data pulse will begin to approach the rising edge of the next data pulse. The speed at which it is not possible to distinguish edges between such consecutive pulses is referred to as the diagnostic data drop out frequency, ($F_{DO}$). Since a logic zero data pulse is approximately half as wide as a logic one data pulse, the logic zero data pulse can be detected at greater speeds (e.g. greater rotational speeds) than a logic one data pulse. Thus, to ensure that the ECU can distinguish one pulse from the next, in accordance with the protocol of the present invention, only logic zero data pulses are transmitted above the diagnostic data drop out frequency $F_{DO}$ When this changeover frequency $F_{DO}$ occurs, the pulses provided by sensor 10 contain speed and direction information, but not diagnostic information. It is also possible when the $F_{DO}$ occurs to begin providing logic zero data pulses on every other edge, allowing the sensor to provide speed data for higher exciter speeds. The ECU would have to know that at the $F_{DO}$ the data coining from the sensor represented only one edge of the exciter, and adjust its frequency calculation accordingly.

It should be appreciated that the target 32 may be similar, for example, to the exciter wheel 20 described above in conjunction with FIG. 1. Those of ordinary skill in the art will appreciate, after reading the present description, that the target may also be provided as a ring magnet or as any other structure capable of producing a response in the sensor 10 (FIG. 1). Likewise, it should now also be appreciated that the target 32 may be provided from any material capable of producing an appropriate response in the sensor 10.

In some embodiments it may be desirable to provide the first pulse width as a minimum pulse width. The minimum pulse width is defined by an effective RC time constant at an output of the sensor. It is preferable to select the narrowest possible pulse width since this increases the speeds at which a pulse can be detected (i.e. the narrower the pulse width, the higher the speed which can be detected. In one embodiment, the minimum pulse width corresponds to a the value of 45 μs and is selected based on knowledge of an effective RC delay on a detection circuit. That is, the minimum pulse width is selected to be wide enough so that even with a worst case RC delay, the pulse will still have its integrity when it reaches the ECU. If it were determined that 10 μs was an adequate period of time for the pulse to still have its integrity when it reached the ECU, then it may be desirable to make the minimum pulse width 10 μs, since that would allow operation at higher data rates. In this particular embodiment, the 45 μs is hard-wired into the circuit, it doesn't in any way "read" the value of the RC present at the output and adjust the pulse width accordingly. In other embodiments, however, it may be desirable to have the sensor (or other circuit) "read" or otherwise determine the RC delay (or other circuit characteristic) and determine an appropriate minimum pulse width.

Figure 3:
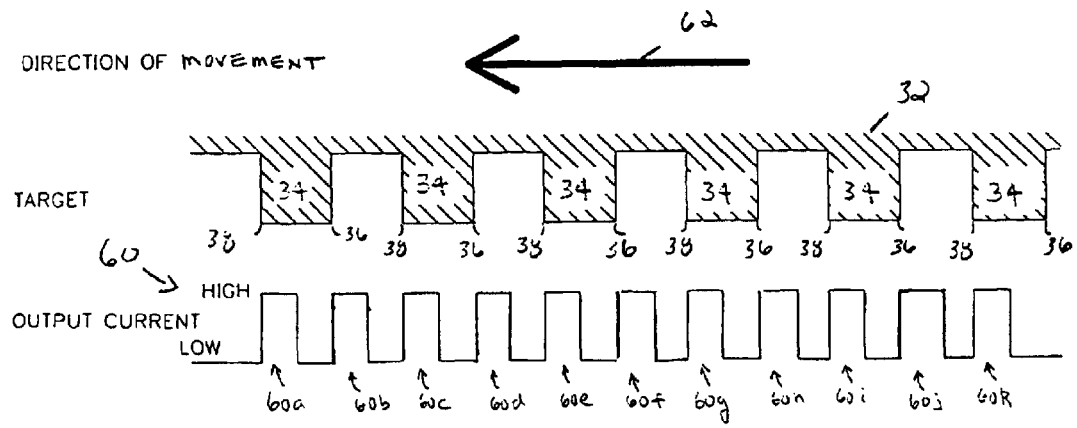
FIG. 3 is a timing diagram showing the sensor output for an object rotating in a second direction.

Referring now to FIG. 3, in which like elements of FIG. 2 are provided having like reference designations, when the movement of the target 32 changes direction from the first direction (i.e. left as shown in FIG. 2) to a second direction, (i.e. right as shown in FIG. 3 and indicated by reference designator 62), the sensor will output a pulse string 60 comprised of a plurality of pulses 60a–60R. Each of the pulses 60a–60R are provided having a pulse width which is four times as long as the first pulse width described above in conjunction with FIG. 2 That is, pulses 60a–60R have pulse widths which are approximately four times greater than the width of the logical "0" pulses 30d, 30e, 30f, 30l shown in FIG. 2. Thus, when the first pulse width in the first direction is 45 μs, then the pulse width in the second direction will be approximately 180 μs. It should be noted that one advantage of the above-described protocol is that although the user must monitor several pulses in succession before diagnostic information can be decoded, the direction of rotation and speed of rotation of a target can be determined by measuring the width of each pulse.

The second direction pulse data string 60 does not contain diagnostic data. To obtain the highest resolution, the second direction pulses 60a–60R occur on each edge 36, 38 of each tooth 34. The higher resolution limits the maximum second direction speed which can be detected. In some embodiments, it may be desirable to detect only one edge of a tooth (rather than every edge) and this approach would increase the maximum speed detected in the second direction but would result in lower resolution. In some embodiments it may be advantageous to provide diagnostic data in the second direction. This could be done, for example, by using a fourth pulse width equal to eight times the first pulse width, or 360 μs, to indicate a logic one in the second direction, and the third pulse width, equal to four times the first pulse width, or 180 μs, would indicate a logic zero in the second direction. As in the case of the first direction, at some specified data rate the fourth pulse width could be dropped and only pulses with the third pulse width would be output. In this case only speed and direction information would be provided, no diagnostic data would be output.

It should be noted that while in the embodiment described above the pulse width is four times the pulse width of the logic zero pulse, any pulse width which can be distinguished from the logic zero and logic one pulse widths can be used. Likewise, although in the embodiment described above in conjunction with FIG. 2, the second pulse width is two times the first pulse width, in some applications it may be desirable to provide the second pulse width as some other multiple of the first pulse width. It may also be desirable to relate the pulses in some other way.

For example, in one embodiment it may be desirable to have different levels of current indicate logic zero, logic one, and direction information. For instance, the nominal current consumption of the circuit might be 6 mA, and 10 mA could indicate logic zero in the first direction, 12 mA could indicate logic one in the first direction, and 14 mA could indicate the second direction. The pulse widths would be the same, but the pulse heights would vary. The difficulties with this approach are (a) it is not easy to have such tight tolerances on the current levels, and (b) monitoring several different thresholds can be costly in terms of external circuit components (such as window comparators). In one embodiment, two current levels are used to indicate whether a pulse is present or not. When it is desired to output a pulse, a current source in the circuit is turned on that causes additional current to flow through resistor 98 in FIG. 5. The comparator 94 has a threshold voltage that lies between the IR drop across resistor 98 when the circuit is in the low current state, and the IR drop across resistor 98 when the circuit is in the high current state. This mode of operation is referred to as two-wire operation, since it doesn't require a third wire to convey a voltage output.

In other embodiments, a so-called three-wire version of the circuit is provided in which the output protocol is provided in voltage format, rather than current format.

Figure 4:
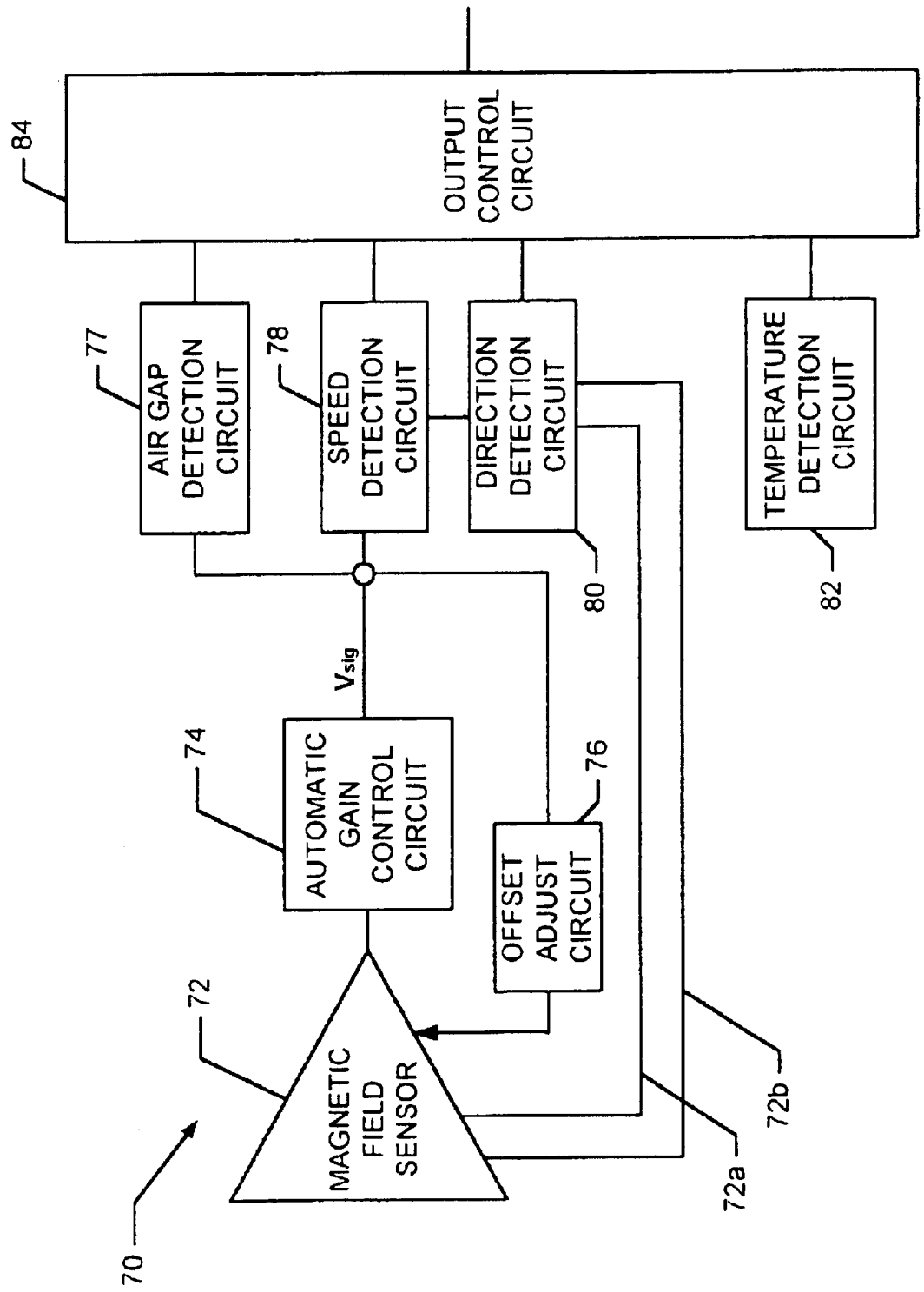
FIG. 4 is a block diagram of a speed and direction sensor.

Referring now to FIG. 4 a sensor 70 includes a magnetic field sensor 72 for providing an output signal proportional to a magnetic field at an output port thereof. In one particular embodiment, the magnetic field sensor 72 can be provided for example from a permanent magnet and a pair of Hall effect sensors. The permanent magnet of the magnetic field sensor 28 e.g. a subassembly in which the magnet and sensor are combined together with a target (e.g. the exciter wheel of FIG. 1) define a magnetic circuit therebetween. The magnetic field sensor 72 provides a magnetic field having a predetermined magnetic flux with a density dependent upon the magnetic strength of the magnetic circuit. The magnetic flux of the magnetic circuit extends between the poles of the permanent magnet one of which is the south pole while the other is the north pole. The poles are oriented to be perpendicular to the Hall effect sensors within the magnetic field sensor such that one of the poles is disposed near the Hall effect sensors while the other pole is displaced from the Hall effect sensors. A large percentage of the magnetic flux is contained within a loop which can be traced from the pole furthest from the Hall effect sensors, across the air gap between this pole and the exciter wheel and back through the air gap to the pole nearest the Hall effect sensors.

With this spatial relationship between the components of the magnetic circuit, the presence of a tooth 22 target (e.g. the teeth 22 of exciter wheel 20 or target 32 in FIGS. 3 and 4) adjacent the sensor 70 causes an increase in the magnetic flux of the magnetic circuit, which lowers the circuit's reluctance and thus affects the sensor unit 70 output as the target moves. The movement of the target (e.g.. the rotation of the exciter wheel 20) produces cyclical fluctuation in the reluctance of the magnetic circuit which thereby causes a corresponding fluctuation in the strength of the magnetic field sensed by the sensor 70. The transverse voltage of the magnetic field sensor 28 increases with an increase in the strength of the magnetic field corresponding to a target being in proximity to the sensor 70 and decreases with a decrease in the strength of the magnetic field corresponding an opening in the target (e.g. slot 24) being in proximity to the sensor 70.

The speed and direction sensor 70 further comprises an automatic gain control circuit (AGC) 74 and an offset adjust circuit 76 coupled to the magnetic field sensor 28. The offset adjust circuit removes a certain amount of the electrical offsets inherent in the magnetic sensor, effectively increasing the sensor's ability to detect small changes in magnetic field.

An air gap detection circuit 77 is coupled to receive signal $V_{sig}$ from the magnetic field sensor 72 through the AGC circuit 74 and is also coupled to an output control circuit 84. The air gap detection circuit 77 detects the distance between the magnetic field sensor and the target that is to be detected. One technique for providing air gap information is described in co-pending patent application No. 60/354,907 assigned to the assignee of the present invention and incorporated herein by reference in its entirety. Briefly, the information is provided to the output control circuit in the form of three logic signals. The output control circuit decodes these three signals to make the correct protocol output word for airgap diagnostics.

A speed detection circuit 78 is coupled to receive signals from the magnetic field sensor 72 through the AGC circuit 74 and is also coupled to an output control circuit 84. The speed detection circuit 78 is used to digitize the analog signal coming from the AGC block, and this digital signal corresponds to the edges of the ferrous exciters or the pole pair interface in the case of a ring magnet. The rate of these digital edges contains the speed information which is passed to the output control circuit 84.

The sensor 70 further comprises a temperature detection circuit 80. Which is also coupled to the output control circuit 84. The temperature detection circuit 80 may be integrated into the same silicon as the Hall sensor, and provides an indication of the temperature of the sensor environment. It is advantageous in many applications to know the ambient temperature of the sensor, such as in the case of an ABS sensor, the ECU can account for the change in viscosity of brake fluid and adjust accordingly the braking pressure. It may also be useful in the event the temperature falls below or rises above predetermined temperature thresholds, the sensor 70 can indicate to the system that the temperature is not within a preferred operating temperature range so that appropriate action can be taken.

A direction detection circuit 82 is also included as part of the sensor 70. The direction detection circuit 82 receives signals from the speed detection circuit and is used to determine a direction of movement of a target. For example in the case where the exciter wheel 20 (FIG. 1) is rotating, the direction detection circuit determines whether the rotation is in a clockwise or counterclockwise direction.

In the case where the magnetic field sensor 72 includes a pair of spaced apart Hall effect sensing elements, the direction of a target (e.g. the exciter wheel 20) can be determined based upon the phase relationship of the output of the two Hall effect transducers. A pair of inputs of the direction detection circuit 82 are connected to respective outputs of the speed detection circuit 78. The signal generated by the direction detection circuit 82 is provided to the output control circuit 70, which will be described below.

It is important to note that in one particular embodiment, the magnetic field sensor 72 is comprised of three Hall elements, lined up in a row, each one spaced apart from an adjacent element by 15 mm. The left Hall element and the middle Hall element are used to generate a differential signal that is the left channel. The middle Hall element and the right Hall element are used to generate a differential signal that is the right channel. Either channel can be used to give the speed information, but both channel's outputs are sent to the direction detection circuit, and the correct direction is determined by examining the phase relationship between the two channels "speed" signal. It should be understood that FIG. 4 assumes that both channels are contained in the Magnetic Field Sensor 72. The two channels are explicitly shown in FIG. 4A described below.

The output control circuit 84 receives a plurality of input signals and from these input signals provides an output signal in accordance with the protocol described above in conjunction with FIGS. 2 and 3. The output control circuit 84 receives a signal from the speed detection circuit 78 indicating the speed of the target (e.g. the speed of the exciter wheel) as it is rotating past the sensor 70. The temperature detection circuit 80 provides 10 the output control circuit 84 a signal(s) which indicates the temperature of the environment in which the sensor is disposed. Likewise, the direction detection circuit 82 provides a signal to the control circuit 84. From all the signals provided to it, the output control circuit 84 produces a pulse stream in accordance with the protocol described above indicating the speed, direction, air gap, and other conditions of the target and the environment in which the sensor is disposed.

As mentioned above in conjunction with FIG. 4, in one particular embodiment, the magnetic field sensor 72 can be provided from a permanent magnet and three Hall effect sensors. The permanent magnet could be provided as the back-biasing, magnet for use in ferrous target detection, or it could be a permanent magnet that exists external to the sensor and is detected by the sensor. By using three sensors, the system can operate as a so-called two channel system FIG. 4A explicitly illustrates the two channels of the sensor.

Figure 4A:
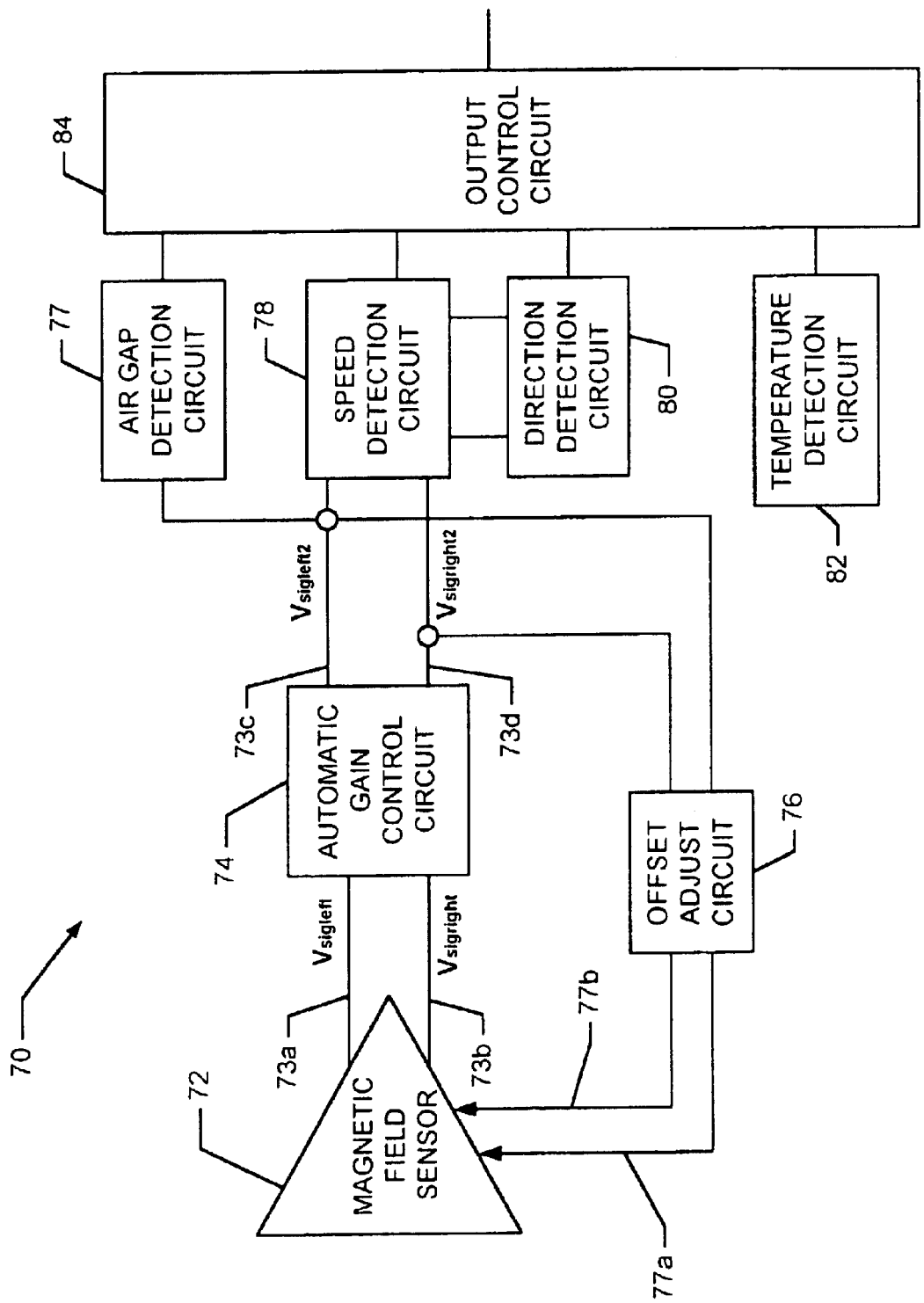
FIG. 4A is a block diagram of a speed and direction sensor.

Referring now to FIG. 4A, in which like elements of FIG. 4 are provided having like reference designations, the sensor 70 includes channels 73a, 73b along which signals $V_{sigleft}$ and $V_{sigright}$, respectively, propagate from the magnetic filed sensor 72. As shown, channels 73a, 73b are coupled between the magnetic filed sensor 72 and the automatic gain control (AGC) circuit 74. Similarly, AGC adjusted signals $V_{sigleft}$ and $V_{sigright}$, respectively, propagate on channels 73c, 73d coupled between the AGC circuit 74 and the speed detection circuit 78. Likewise, two channels are coupled between the speed detection circuit 78 and the direction detection circuit 80.

The offset adjust circuit 76 couples at least a portion of each of the channels 73a, 73b and provides offset adjust signals through signal paths 77a, 77b to the magnetic field sensor 72 Thus, the offset adjust circuit 76 ideally removes electrical offsets inherent in the Hall effect sensors which comprise the magnetic field sensor 72, thereby effectively increasing the ability of the magnetic field sensor 72 to detect small changes in magnetic field.

The air gap detection circuit 77 is coupled to the channel 73a at the output of the AGC circuit and detects the distance between the magnetic field sensor and the target that is to be detected. Although, the air gap detection circuit 77 is here shown coupled to the channel 73a, it could also be coupled to channel 73b, or to both channels 73a and 73b.

One technique for providing air gap information is described in co-pending patent application entitled Peak-to-Peak Signal Detector, filed Feb. 5, 2002, assigned application No. 60/354,907 assigned to the assignee of the present invention and incorporated herein by reference in its entirety. Briefly, the information is provided to the output control circuit in the form of three logic signals. The output control circuit decodes these three signals to make the correct protocol output word for airgap diagnostics.

Figure 5:
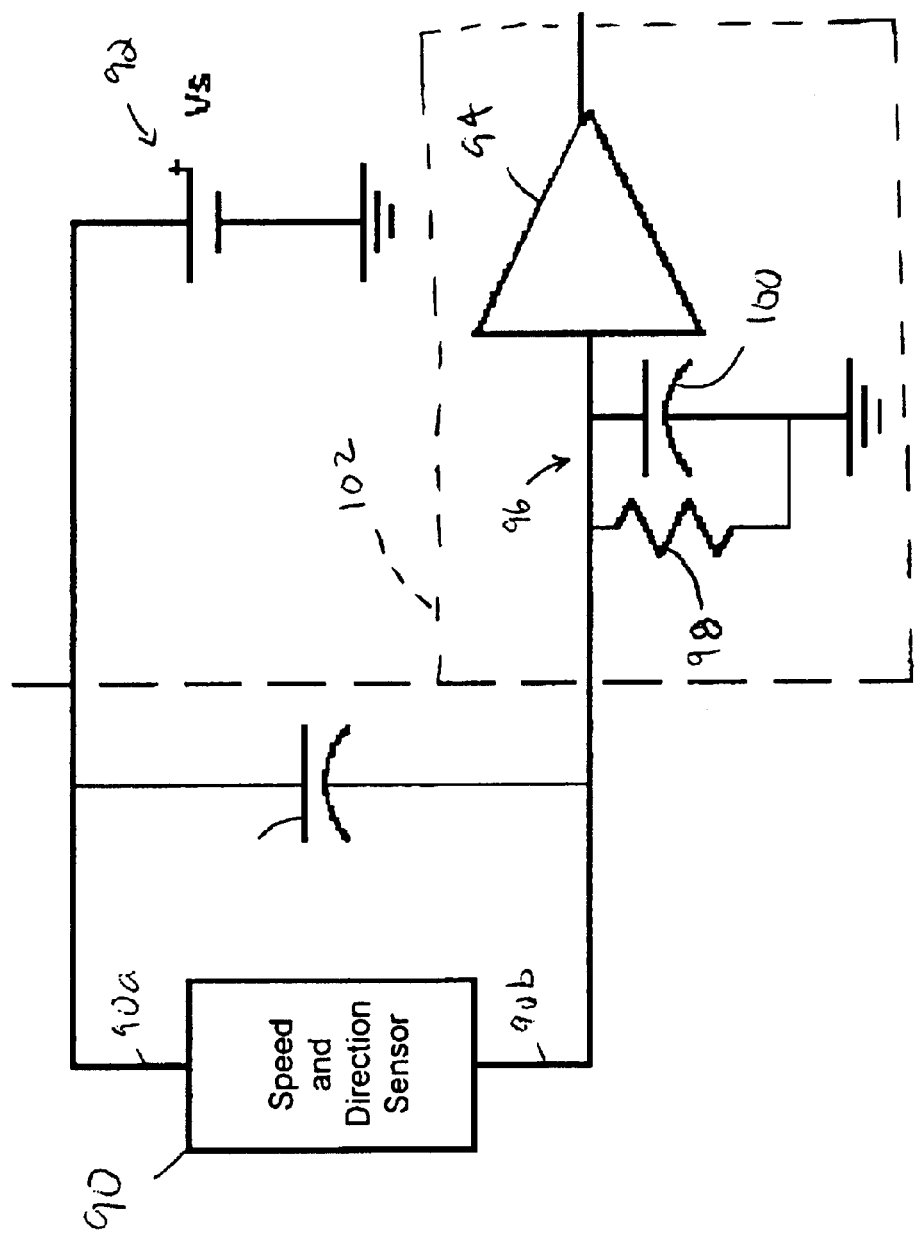
FIG. 5 is a block diagram of a speed and direction sensor and associated support electronics shown in a so-called "two wire" configuration where the sensor's output pulses are measured as changes in the sensor's supply current flowing through a sense resistor.

Referring now to FIG. 5, a speed and direction detection sensor 90 which may be similar to the speed and direction sensors 10, 70 described above 1 conjunction with FIGS. 1 and 4, has first and second terminals 90a, 90b. The first terminal 90a is coupled to a first terminal of a power supply 92 Here the power supply 92 is provided as a voltage source and the first terminal of the power supply corresponds to the positive terminal of the voltage source. The second terminal 90b of the sensor 90 is coupled through an RC circuit 96 to an input terminal of a comparator 94. The RC circuit 96 has a first terminal coupled to the amplifier input and a second terminal coupled to a reference potential here corresponding to ground. The RC circuit 96 comprises a resistor 98 and a capacitor 100. The purpose of the resistor is to provide a voltage drop corresponding to the product of the current delivered by the sensor, and the value of the resistor. The sensor outputs a pulse by increasing its current consumption, and this increase in current through the resistor 98 trips the comparator 94.

The sensor 90 provides the pulse signals to the comparator 94 which may be provided as a portion of an ECU circuit 102. The comparator provides an output signal to other circuitry (not shown), such as an anti-lock brake control which may be located remotely from the sensor itself.

Figure 6:
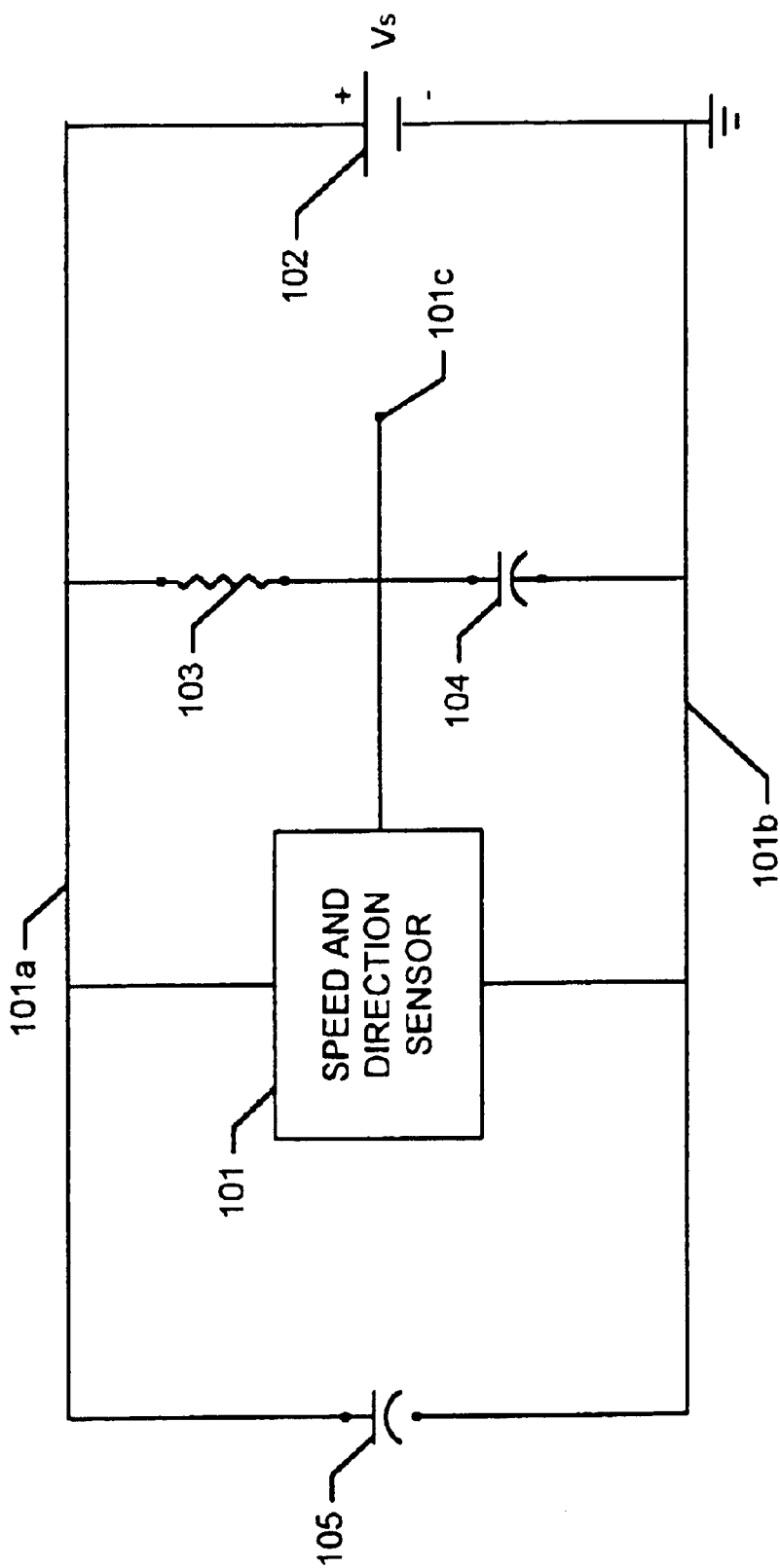
FIG. 6 is a block diagram of a speed and direction sensor and associated support electronics shown in a so-called "three-wire" configuration where the sensor has a third wire whose voltage level changes to indicate the output pulses.

Referring now to FIG. 6, a speed and direction detection sensor 101 which may be similar to the speed and direction sensors 10, 70 described above in conjunction with FIGS. 1 and 4, has first, second and third terminals 101a, 101b and 101c. The first terminal 101a is coupled to a first terminal of a power supply 102 Here the power supply 102 is provided as a voltage source and the first terminal of the power supply corresponds to the positive terminal of the voltage source $V_s$. The second terminal 101b of the sensor 101 is coupled to a reference potential here corresponding to ground. A decoupling capacitor 105 is provided between the terminals 101a and 101b of sensor 101. The third sensor terminal 101c, also called the sensor's output terminal, is coupled to a resistor 103 and capacitor 104. The second terminal of resistor 103 is tied to the positive terminal of the voltage source. The purpose of the resistor is to pull the sensor output terminal 101c up to the positive terminal of the voltage source 102 when the sensor's output is in the non-conducting state. When the sensor's output becomes conductive, the voltage at terminal 101c will approach the reference potential, here corresponding to ground. Terminal 101c may be connected to an external ECU input to indicate the status of the sensor 101 to the ECU, by means of the changing, voltage level on terminal 101c of the sensor 101. The second terminal of capacitor 104 is tied to the reference potential, here corresponding to ground. The purpose of the capacitor 104 is to filter external electrical noise appearing on terminal 101c of the sensor 101.

As described above, a method and apparatus are used to provide information from a speed and direction sensor. The method includes not only speed and direction information but also provides information relating to the environment surrounding, the sensor, such as information relating to the air gap between the sensor and the object being sensed, and information relating to the temperature the sensor is disposed in. In a preferred embodiment the sensor is utilized to provide speed, direction and diagnostic information for gear-tooth-based rotating targets found in automotive ABS and transmission applications.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety

What is claimed is:

1. A magnetic article proximity detector for detecting a magnetic article, the magnetic article proximity detector comprising:
   a magnetic field sensor for providing an output signal proportional to a magnetic field;
   a detection circuit to detect at least one of: (a) a parameter of the environment in which the magnetic article is disposed; (b) a parameter of the environment in which the magnetic article proximity detector is disposed; (c) a parameter related to a relationship between the magnetic article proximity detector and the magnetic article; and (d) a parameter of the magnetic article; and
   an output control circuit coupled to receive one or more signals from said detection circuit, and in response to the one or more signals for providing a data string in accordance with a predetermined protocol in which a first logic data bit having a first logic value in the data string is provided from a first single pulse having a first pulse characteristic and a second logic data bit having a second different logic value in the data string is provided from a second single pulse having a second different pulse characteristic, wherein the second different pulse characteristic is multiple of the first pulse characteristic.

2. The detector of claim 1 wherein said detection circuit comprises at least one of:
   a speed detection circuit coupled to said magnetic field sensor and said output control circuit;
   a direction detection circuit coupled to said magnetic field sensor and said output control circuit;
   a temperature detection circuit having an output coupled to said magnetic field sensor and said output control circuit;
   an air gap detection circuit coupled said magnetic field sensor and said output control circuit; and
   a voltage detection circuit coupled said magnetic field sensor and said output control circuit.

3. The detector of claim 2 wherein said direction detection circuit is coupled to said magnetic field sensing circuit through said speed detection circuit.

4. The detector of claim 2 further comprising an automatic gain control (AGC) circuit coupled between said magnetic field sensor and said speed detection circuit.

5. The detector of claim 4 further comprising an offset adjustment circuit coupled between said magnetic field sensor and said AGC circuit.

6. The detector of claim 1 wherein said magnetic field sensor comprises:
   a first Hall effect sensor;
   a second Hall effect sensor disposed a distance away from said first Hall effect sensor;
   a magnet having a first pole disposed near said first and second Hall effect sensors and a second pole displaced from said first and second Hall effect sensors; and
   an amplifier circuit coupled to receive outputs from said first and second Hall effect sensors and for providing an amplified output signal at the output of said magnetic field sensor.

7. The detector of claim 1 wherein:
   the first logic data bit corresponds to a logic zero;
   the second logic data bit corresponds to a logic one; and
   wherein said data string includes a start data sequence (SDS) and at least one data word containing diagnostic information.

8. The detector of claim 7 wherein said at least one data word is comprised of two data logic bits.

9. The detector of claim 7 wherein said at least one data word is comprised of three or more data logic bits.

10. The detector of claim 7 wherein said at least one data word represents at least one condition related to one of:
    (a) air gap out of range;
    (b) air gap close to out of range;
    (c) air gap less than nominal but not close to out of range;
    (d) air gap greater than a nominal value;
    (e) temperature less than a first predetermined low threshold temperature;
    (f) temperature greater than a second predetermined high threshold temperature; and
    (g) temperature between first predetermined low threshold temperature and second high predetermined threshold temperature.

11. The detector of claim 1 wherein, in response to a target moving in a first direction, said output control circuit provides a first data string which includes diagnostic information.

12. The detector of claim 11 wherein, in response to the target moving in a second different direction, said output control circuit provides a second data string which does not include diagnostic information.

13. The detector of claim 11 wherein, in response to the target moving in a second different direction, said output control circuit provides a second data string which includes diagnostic information.

14. The detector of claim 1 wherein the pulse characteristic corresponds to one of:
   a. a pulse width characteristic;
   b. a pulse current level characteristic; and
   c. a pulse voltage level characteristic.

15. The detector of claim 14 wherein:
   a first current level corresponds to a first logic value;
   a second current level corresponds to a second different logic value; and
   a third current level corresponds to direction information.

16. The detector of claim 1 wherein the protocol is provided in voltage format.

17. The detector of claim 1 wherein said magnetic field sensor comprises at least three Hall elements arranged in a row, each Hall element spaced apart from an adjacent Hall element by a predetermined distance and wherein in a first pair of Hall elements generate a first differential signal and a second pair of Hall elements generate a second differential signal.

18. The detector of claim 17 wherein the first pair of Hall elements correspond to a left Hall element and a middle Hall element and the first differential signal corresponds to a left channel.

19. The detector of claim 18 wherein the second pair of Hall elements correspond to a right Hall element and a middle Hall element and the second differential signal corresponds to a right channel.

20. The detector of claim 19 wherein both the left and right channels are adapted to provide speed information, and output signals from both the left and right channels are provided to the direction detection circuit which examines a phase relationship between the output signal of the left channel and the output signal of the right channel to determine a direction in which the magnetic article is moving with respect to the magnetic article proximity detector.

21. A magnetic article proximity detector for detecting a magnetic article, the magnetic article proximity detector comprising:
   a magnetic field sensor for providing an output signal proportional to a magnetic field;
   a detection circuit to detect at least one of: (a) a parameter of the environment in which the magnetic article is disposed; (b) a parameter of the environment in which the magnetic article proximity detector is disposed; (c) a parameter related to a relationship between the magnetic article proximity detector and the magnetic article; and (d) a parameter of the magnetic article; and
   an output control circuit coupled to receive one or more signals from said detection circuit, and in response to the one or more signals for providing a data string in accordance with a predetermined protocol in which a first logic data bit having a first logic value in the data string is provided from a first single pulse having a first pulse width and a second logic data bit having a second different logic value in the data string is provided from a second single pulse having a second different pulse width.

22. The detector of claim 21, wherein the second different pulse width is a multiple of the first pulse width.

* * * * *

UNITED STATES PATENT AND TRADEMARK OFFICE
CERTIFICATE OF CORRECTION

PATENT NO. : 6,815,944 B2
DATED : November 9, 2004
INVENTOR(S) : Ravi Vig et al.

It is certified that error appears in the above-identified patent and that said Letters Patent is hereby corrected as shown below:

Drawings,
Figure 1, replace with the following Figure:

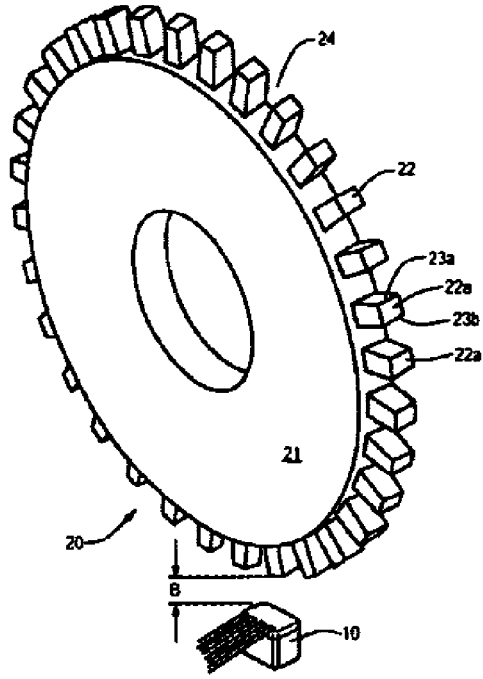

FIG. 1

UNITED STATES PATENT AND TRADEMARK OFFICE
CERTIFICATE OF CORRECTION

PATENT NO. : 6,815,944 B2
DATED : November 9, 2004
INVENTOR(S) : Ravi Vig et al.

It is certified that error appears in the above-identified patent and that said Letters Patent is hereby corrected as shown below:

Drawings,(cont.)
Figure 2, replace with the following Figure:

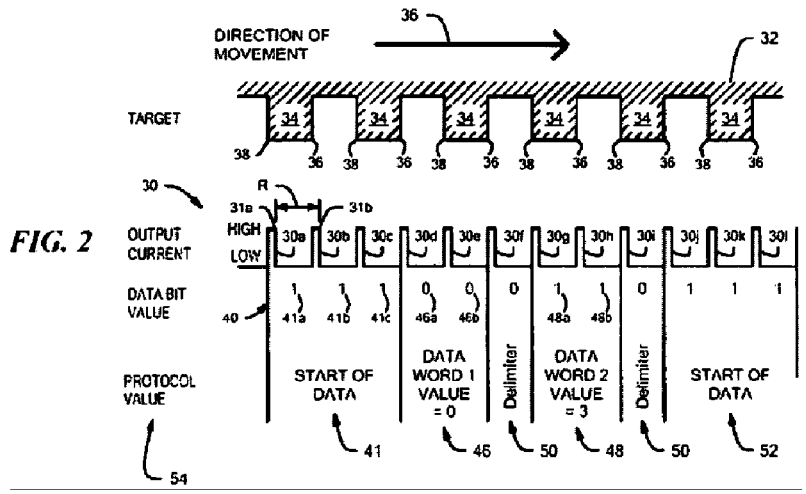

UNITED STATES PATENT AND TRADEMARK OFFICE
CERTIFICATE OF CORRECTION

PATENT NO.   : 6,815,944 B2                                        Page 3 of 6
DATED        : November 9, 2004
INVENTOR(S)  : Ravi Vig et al.

It is certified that error appears in the above-identified patent and that said Letters Patent is hereby corrected as shown below:

Drawings,(cont.)
Figure 3, replace with the following Figure:

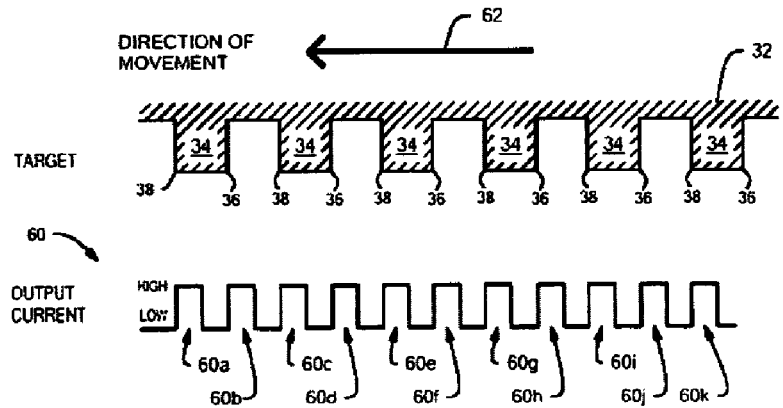

FIG. 3

UNITED STATES PATENT AND TRADEMARK OFFICE
CERTIFICATE OF CORRECTION

PATENT NO.   : 6,815,944 B2
DATED        : November 9, 2004
INVENTOR(S)  : Ravi Vig et al.

It is certified that error appears in the above-identified patent and that said Letters Patent is hereby corrected as shown below:

Drawings,(cont.)
Figure 5, replace with the following Figure:

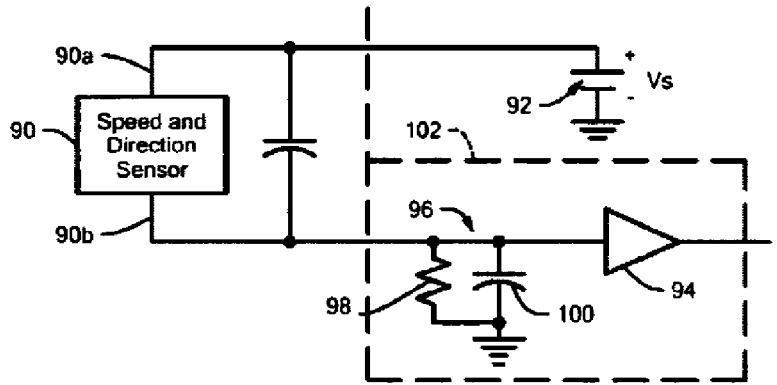

FIG. 5

UNITED STATES PATENT AND TRADEMARK OFFICE
CERTIFICATE OF CORRECTION

PATENT NO. : 6,815,944 B2
DATED : November 9, 2004
INVENTOR(S) : Ravi Vig et al.

It is certified that error appears in the above-identified patent and that said Letters Patent is hereby corrected as shown below:

Column 1,
Line 40, delete "magnetizing, force." and replace with -- magnetizing force. --.

Column 4,
Line 40, delete "string, is" and replace with -- string is --.

Column 5,
Line 29, delete "direction." and replace with -- direction; --.
Line 37, delete "resistor." and replace with -- resistor; --.

Column 6,
Line 47, delete "detects" and replace with -- detects. --.
Line 56, delete "hi" and replace with -- in --.

Column 7,
Line 9, delete "(e g" and replace with -- (e.g. --.
Line 14, delete "air (rap" and replace with -- air gap --.

Column 8,
Line 24, delete "48, 48" and replace with -- 46, 48 --.
Line 44, delete "stringy" and replace with -- string --.

Column 9,
Lines 31-32, delete "condition" and replace with -- condition, --.
Line 34, delete "Value" and replace with -- value --.

Column 10,
Line 11, delete "$F_{DO}$" and replace with -- $F_{DO}$ --.
Line 18, delete "$F_{DO}$ the data coining" and replace with
-- $F_{DO}$, the data coming --.
Line 63, delete "FIG. 2" and replace with -- FIG. 2. --.

Column 11,
Line 28, delete "above the" and replace with -- above, the --.
Lines 65-66, delete "provided for example" and replace with
-- provided, for example, --.

Column 12,
Line 9, delete "magnet one" and replace with -- magnet, one --.
Line 17, delete "exciter wheel" and replace with -- exciter wheel 20 --.
Line 66, delete "80. Which" and replace with -- 80 which --.

UNITED STATES PATENT AND TRADEMARK OFFICE
CERTIFICATE OF CORRECTION

PATENT NO. : 6,815,944 B2
DATED : November 9, 2004
INVENTOR(S) : Ravi Vig et al.

It is certified that error appears in the above-identified patent and that said Letters Patent is hereby corrected as shown below:

Column 13,
Line 32, delete "15 mm." and replace with -- 1.5 mm. --.
Line 51, delete "provides 10 the" and replace with -- provides to the --.
Line 64, delete "back-biasing, magnet" and replace with
-- back-biasing magnet --.

Column 14,
Line 1, delete "system" and replace with -- system. --.
Lines 6 and 8, delete "filed" and replace with -- field --.
Lines 9-10, delete "$V_{sigleft}$ and $V_{sigright}$," and replace with
-- $V_{sigle2t}$ and $V_{sigright2}$, --.
Line 18, delete "72 Thus," and replace with -- 72. Thus, --.
Line 40, delete "above 1" and replace with -- above in --.
Line 43, delete "92 Here" and replace with -- 92. Here --.

Column 15,
Line 1, delete "102 Here" and replace with -- 102. Here --.
Line 28, delete "surrounding, the sensor," and replace with
-- surrounding the sensor,--.
Line 31, delete "embodiment the" and replace with -- embodiment, the --.
Line 35, delete "invention" and replace with -- invention, --.

Column 16,
Line 1, delete "is multiple" and replace with -- is a multiple --.

Signed and Sealed this

Tenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,815,944 B2  
DATED : November 9, 2004  
INVENTOR(S) : Ravi Vig et al.

It is certified that error appears in the above-identified patent and that said Letters Patent is hereby corrected as shown below:

Drawings,
Figure 2, replace with the following Figure:

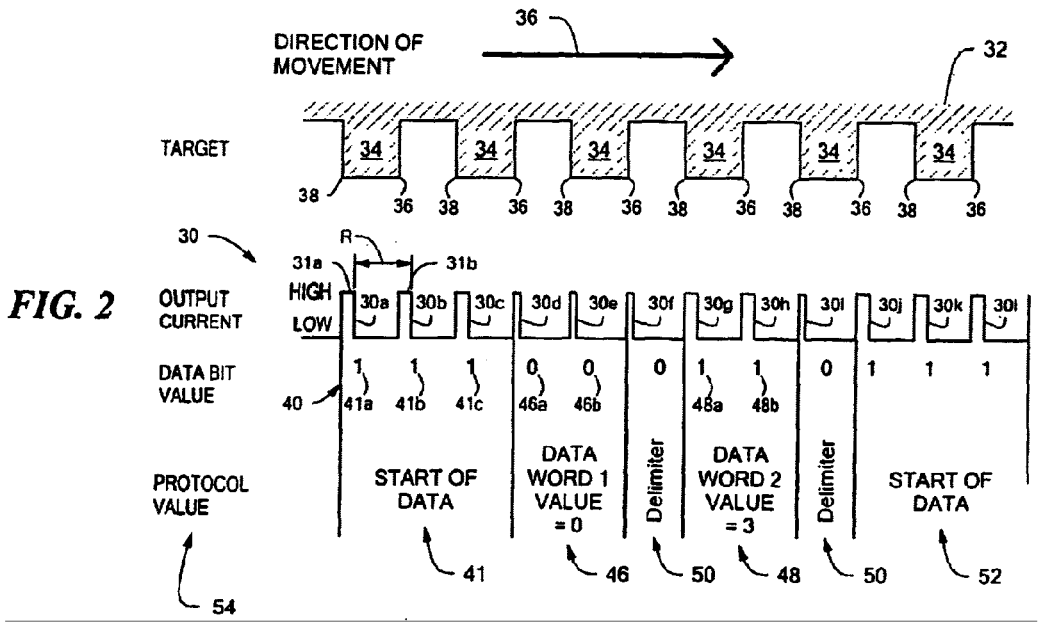

Signed and Sealed this

Twenty-third Day of August, 2005

JON W. DUDAS  
*Director of the United States Patent and Trademark Office*